United States Patent
Tsao et al.

(10) Patent No.: US 12,084,759 B2
(45) Date of Patent: Sep. 10, 2024

(54) ARTIFICIAL DIAMOND PLASMA PRODUCTION DEVICE

(71) Applicant: WAVE POWER TECHNOLOGY INC., Toufen (TW)

(72) Inventors: Ming-Hsiung Tsao, Zhubei (TW);
Hsuan-Hao Teng, Taichung (TW);
Han-Ying Chen, Chupei (TW)

(73) Assignee: WAVE POWER TECHNOLOGY INC., Toufen (TW)

( * ) Notice: Subject to any disclaimer, the term of this patent is extended or adjusted under 35 U.S.C. 154(b) by 505 days.

(21) Appl. No.: 17/570,517

(22) Filed: Jan. 7, 2022

(65) Prior Publication Data

US 2023/0220543 A1   Jul. 13, 2023

(51) Int. Cl.
*C23C 16/27* (2006.01)
*C23C 16/511* (2006.01)
(Continued)

(52) U.S. Cl.
CPC .......... *C23C 16/274* (2013.01); *C23C 16/511* (2013.01); *C30B 29/04* (2013.01); *H01J 37/32229* (2013.01); *H01J 37/32238* (2013.01); *H01J 37/32293* (2013.01); *H01J 2237/332* (2013.01)

(58) Field of Classification Search
CPC ..... C23C 16/274; C23C 16/511; C30B 29/04; H01J 2237/332; H01J 37/32192; H01J 37/32229; H01J 37/32238; H01J 37/32256; H01J 37/32293
See application file for complete search history.

(56) References Cited

U.S. PATENT DOCUMENTS 5,023,056 A * 6/1991 Aklufi ................ H01J 37/32211
204/157.43
2002/0148564 A1  10/2002 Ishii et al.
(Continued)

FOREIGN PATENT DOCUMENTS

CN  104470020 A  3/2015
CN  106025453 A  10/2016
(Continued)

*Primary Examiner* — Matthew J Song
(74) *Attorney, Agent, or Firm* — RABIN & BERDO, P.C.

(57) ABSTRACT

An artificial diamond plasma production device has a reaction chamber, a microwave emitting module, and a microwave lens. The microwave emitting module emits a circularly-polarized microwave into the reaction chamber. The microwave emitting module has a polarizing tube, a directing tube, a first waveguide, and a first linearly-polarized microwave source serially connected along a microwave traveling path. The microwave emitting module further has a second waveguide and a first matched load. The polarizing tube is configured to convert a linearly-polarized microwave into a circularly-polarized microwave or the other way round depending on traveling direction of the microwave. The directing tube has a first opening and a second opening which face toward different directions. The first waveguide is connected to the first opening. The first matched load is connected to the second opening via the second waveguide. Therefore, reflected microwave can be channeled out of the reaction chamber.

19 Claims, 9 Drawing Sheets

(51) Int. Cl.
*C30B 29/04* (2006.01)
*H01J 37/32* (2006.01)

(56) References Cited

U.S. PATENT DOCUMENTS

| | | | |
|---|---|---|---|
| 2017/0253963 A1 | 9/2017 | Sabens et al. | |
| 2020/0136220 A1* | 4/2020 | Ravanelli | H01P 5/024 |
| 2021/0317571 A1 | 10/2021 | Tsao et al. | |
| 2022/0344132 A1* | 10/2022 | Hsu | H05H 1/46 |

FOREIGN PATENT DOCUMENTS

| | | | | |
|---|---|---|---|---|
| CN | 112813421 A | | 5/2021 | |
| JP | H05-239656 A | | 9/1993 | |
| JP | 2006-140395 A | | 6/2006 | |
| JP | 2009-231662 A | | 10/2009 | |
| JP | 2017-521556 A | | 8/2017 | |
| JP | 2021172534 A | * | 11/2021 | C30B 29/04 |
| TW | 201511618 A | | 3/2015 | |
| TW | I734405 B | | 7/2021 | |
| TW | 202134473 A | | 9/2021 | |

* cited by examiner

ARTIFICIAL DIAMOND PLASMA PRODUCTION DEVICE

BACKGROUND OF THE INVENTION

1. Field of the Invention

The present invention relates to an artificial diamond production device, especially to an artificial diamond production device that utilizes microwave plasma chemical vapor deposition method to synthesize artificial diamonds.

2. Description of the Prior Arts

A conventional artificial diamond plasma production device has a reaction chamber and a microwave emitting module. A diamond holder is disposed in the reaction chamber, and the microwave emitting module emits 2.45 GHz microwave toward the reaction chamber to form a regional standing wave with a strong electric field on the diamond holder.

To produce an artificial diamond, place a diamond seed crystal on the diamond holder and fill the reaction chamber with high concentration methane gas. The energy of the microwave emitted by the microwave emitting module heats up the methane gas around the diamond seed crystal to an extremely high temperature and forms a plasma ball where the carbon atoms of the methane gas are made to attach to the diamond seed crystal. As a result, the diamond seed crystal gradually grows into an artificial diamond which is greater in size.

In order to improve the efficiency of producing the artificial diamonds, an artificial diamond production device having a circular-polarizing tube and a focusing mechanism is disclosed in TW. Patent I734405B. Microwave is first converted into circularly-polarized microwave, and then focused on the diamond seed crystal such that the plasma ball can be formed stably around the diamond seed crystal, thereby improving efficiency of producing the artificial diamonds.

However, test results of a prototype artificial diamond production device in accordance with TW. Patent I734405B indicate that although the circularly-polarized microwave improves stability of the plasma ball, the microwave also tends to reflect multiple times inside the reaction chamber due to impedance mismatch, causing complex reflective standing waves to build up in the waveguide between the microwave source and reaction chamber. Because the complex reflective standing waves undermine stability of the plasma ball around the diamond seed crystal, the efficiency of artificial diamond production is reduced.

In short, although the artificial diamond production device disclosed in TW. Patent I734405B improves the efficiency of the artificial diamond production in theory, an actual device fails because too much useless microwave energy is accumulated in the reaction chamber.

To overcome the shortcomings, the present invention provides an artificial diamond plasma production device to mitigate or obviate the aforementioned problems.

SUMMARY OF THE INVENTION

The main objective of the present invention is to provide an artificial diamond plasma production device that prevents a microwave from reflecting multiple times inside the waveguide which is between the microwave source and reaction chamber.

The artificial diamond plasma production device has a reaction chamber, a microwave emitting module, and a microwave lens. The reaction chamber is hollow and has a microwave window and a diamond holder. The microwave window is disposed on the reaction chamber such that an external microwave is capable of traveling into the reaction chamber via the microwave window. The diamond holder is disposed in the reaction chamber, wherein an imaginary focus region is defined on the diamond holder. The microwave emitting module is disposed outside of the reaction chamber and emits a circularly-polarized microwave toward the microwave window of the reaction chamber. The microwave emitting module has a polarizing tube, a directing tube, a first waveguide, and a first linearly-polarized microwave source that are serially connected. The microwave emitting module further has a second waveguide and a first matched load. The polarizing tube has a circular polarization opening and a linear polarization opening. The circular polarization opening is disposed on an end of the polarizing tube and faces toward the microwave window of the reaction chamber. The linear polarization opening is disposed on another end of the polarizing tube. When an external linearly-polarized microwave enters the polarizing tube via the linear polarization opening, said external linearly-polarized microwave is converted into a circularly-polarized microwave and exits via the circular polarization opening; when an external circularly-polarized microwave enters the polarizing tube via the circular polarization opening, said external circularly-polarized microwave is converted into a linearly-polarized microwave and exits via the linear polarization opening. The directing tube has a main opening, a first opening, and a second opening. The main opening is disposed on an end of the directing tube and is connected to the linear polarization opening of the polarizing tube. The second opening is disposed on a sidewall of the directing tube. An opening direction toward which the second opening faces is non-parallel to an opening direction toward which the first opening faces. An end of the first waveguide is connected to the first opening of the directing tube, and another end of the first waveguide is connected to the first linearly-polarized microwave source. The first linearly-polarized microwave source generates a linearly-polarized microwave. Said linearly-polarized microwave is converted into a circularly-polarized microwave by the polarizing tube and is emitted toward the microwave window of the reaction chamber via the circular polarization opening of the polarizing tube. An end of the second waveguide is connected to the second opening of the directing tube. The first matched load is mounted on the second waveguide. The microwave lens is disposed between the circular polarization opening of the polarizing tube of the microwave emitting module and the diamond holder of the reaction chamber. The microwave lens converges the circularly-polarized microwave emitted by the microwave emitting module to the focus region of the diamond holder.

The advantage of the present invention is that the microwave emitting module has the polarizing tube, the directing tube, and the first matched load in the microwave emitting module. When the circularly-polarized microwave reflects multiple times due to reasons such as impedance mismatch, the reflected circularly-polarized microwave can be transformed back to linearly-polarized microwave, and then travel to the first matched load via the second opening of the directing tube, and finally transformed to heat by the first matched load.

As a result, the present invention prevents complex reflective standing waves from forming in the reaction chamber by channeling useless microwave energy out of the reaction chamber, thereby keeping a stable plasma ball around the diamond seed crystal and improving efficiency of artificial diamond production.

To be specific, the linearly-polarized microwave emitted by the first linearly-polarized microwave source travels through the directing tube, is transformed into the circularly-polarized microwave by the polarizing tube, and enters the reaction chamber to form a diamond.

The reflected circularly-polarized microwave is transformed into the linearly-polarized microwave again by the polarizing tube, but electrical filed of said linearly-polarized microwave is perpendicular to that of the linearly-polarized microwave originally emitted by the first linearly-polarized microwave source after being transformed twice. As a result, reflected microwave can no longer exit the directing tube via the first opening, explaining why too much useless microwave energy is accumulated in the reaction chamber in accordance with the TW. Patent I734405B.

On the other hand, the directing tube in the present invention has the second opening which is non-parallel to the first opening and therefore allowing the reflected microwave energy to exit the directing tube via the second opening. As a result, useless microwave energy is channeled out of the reaction chamber.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
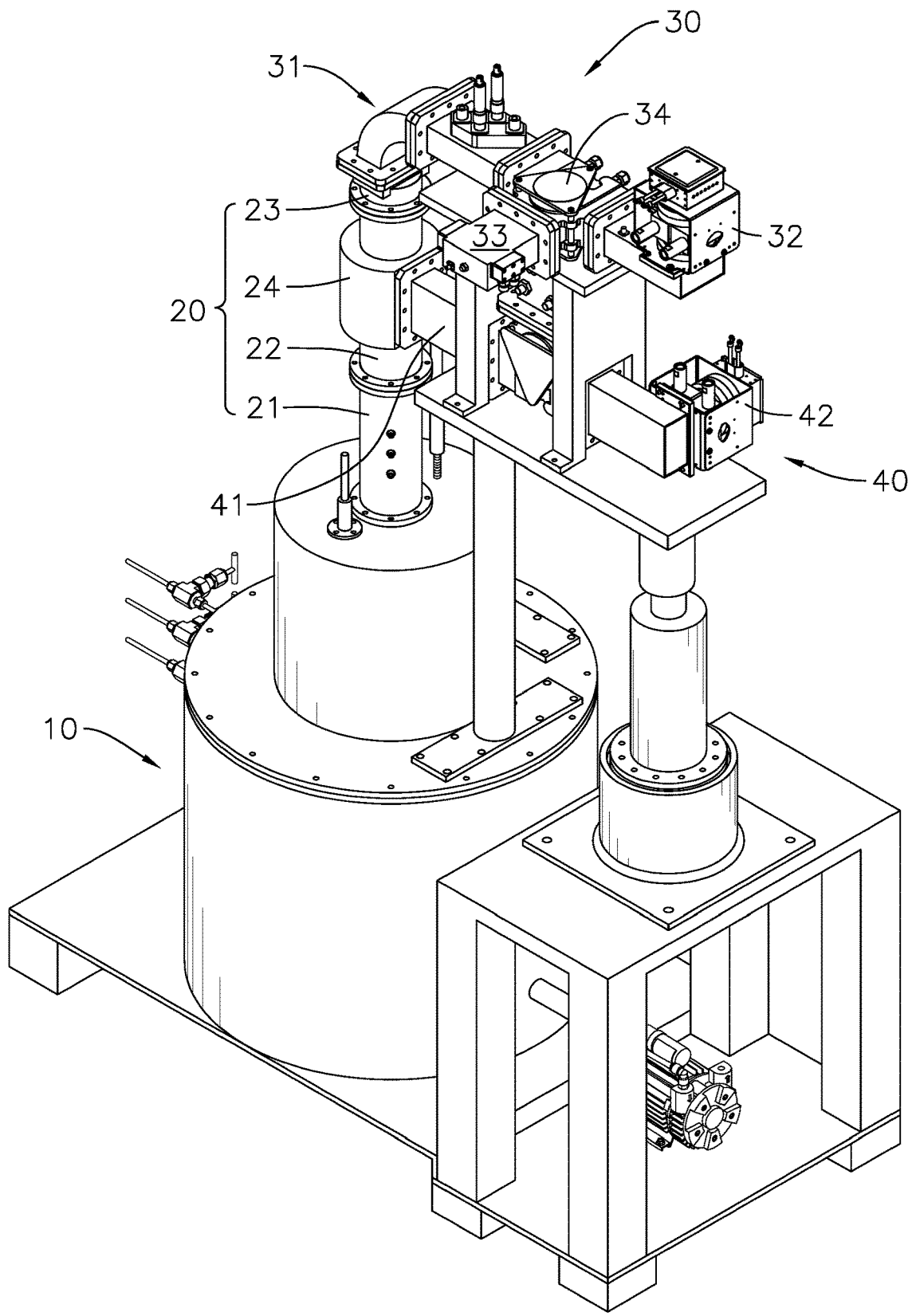
FIG. 1 is a perspective view of an artificial diamond plasma production device in accordance with the present invention.
Figure 2:
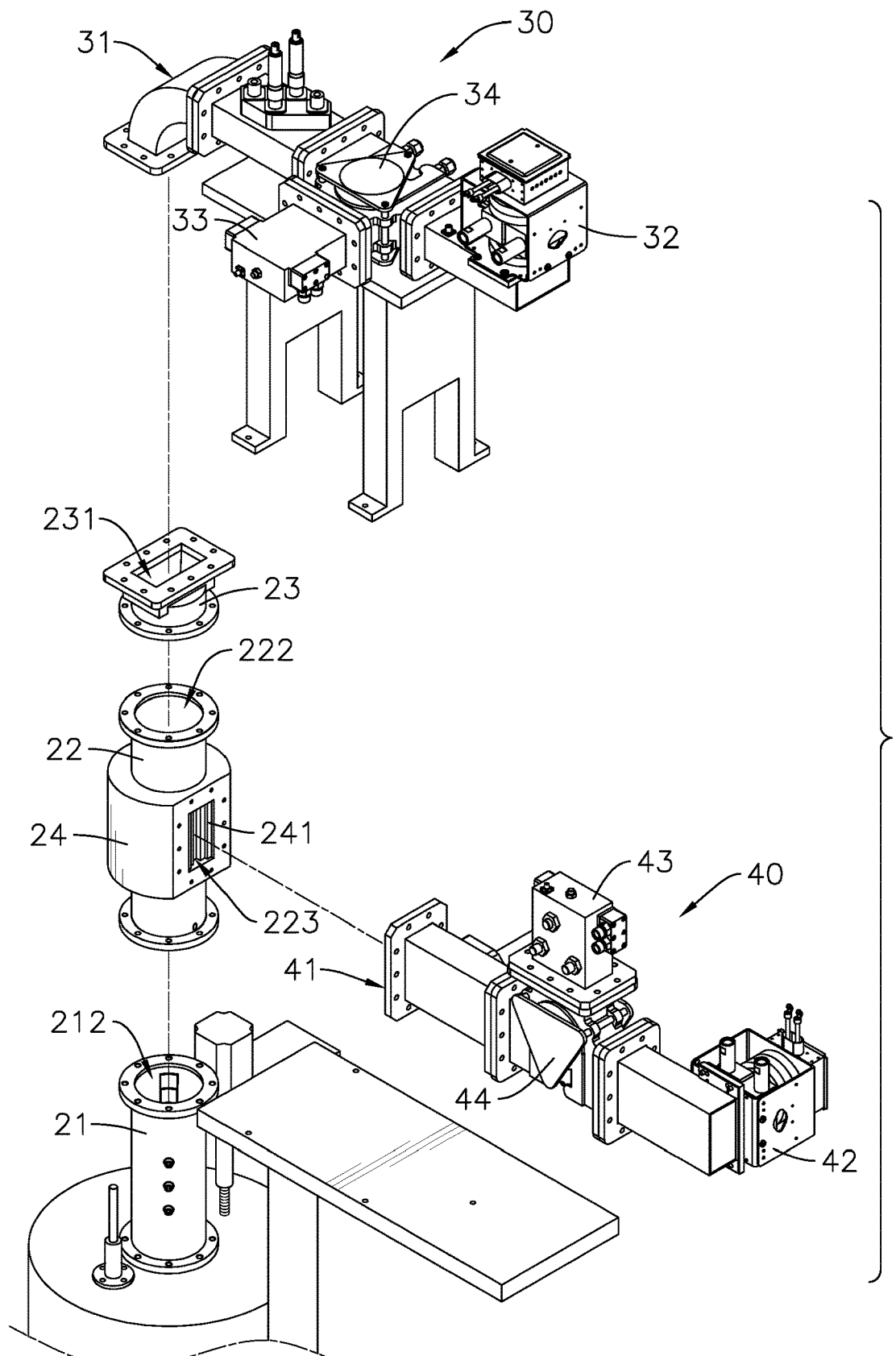
FIG. 2 is an exploded perspective view of the artificial diamond plasma production device in FIG. 1.
Figure 4:
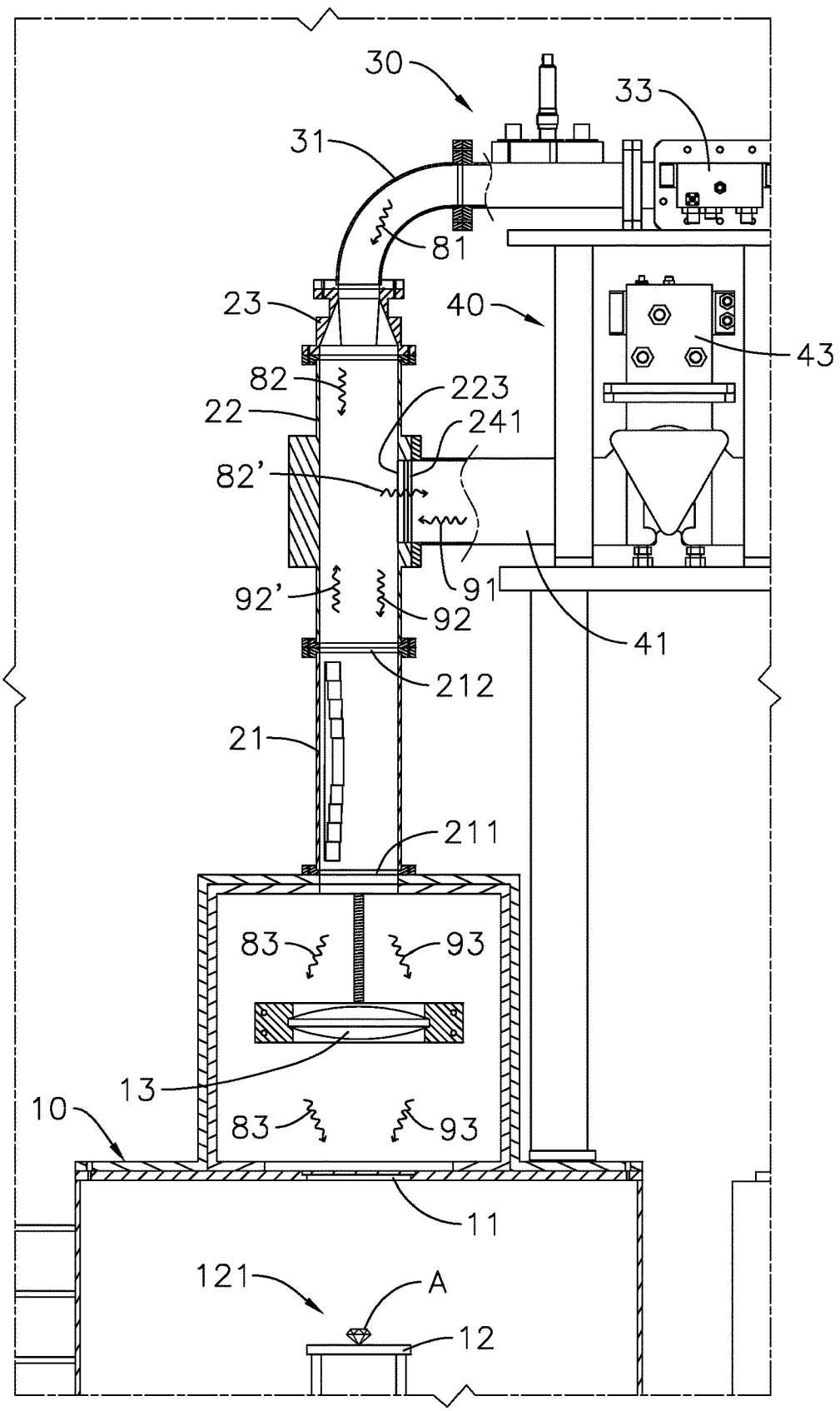
FIG. 4 is an enlarged longitudinal sectional view of the artificial diamond plasma production device in FIG. 1.

With reference to FIGS. 1, 2, and 4, an artificial diamond plasma production device in accordance with the present invention comprises a reaction chamber 10, a microwave emitting module, and a microwave lens 13.

The reaction chamber 10 is hollow and has a microwave window 11 and a diamond holder 12. The microwave window 11 is microwave-transparent and is disposed on the reaction chamber 10 such that an external microwave can travel into the reaction chamber 10 via the microwave window 11. To be precise, the microwave window 11 is disposed on a casing of the reaction chamber 10. The diamond holder 12 is disposed in the reaction chamber 10. An imaginary focus region 121 is defined on a top surface of the diamond holder 12.

The microwave emitting module is disposed outside of the reaction chamber 10 and emits a circularly-polarized microwave toward the microwave window 11 of the reaction chamber 10. The microwave emitting module has a polarizing tube 21, a directing tube 22, a first waveguide 31, a first linearly-polarized microwave source 32, a second waveguide 41, and a first matched load 43; in the preferred embodiment, the microwave emitting module further has a rectangular-to-circular tube 23, a connecting sleeve 24, a second linearly-polarized microwave source 42, and a second matched load 33. The polarizing tube 21, the directing tube 22, the first waveguide 31, and the first linearly-polarized microwave source 32 are serially connected along a microwave traveling path.

In the preferred embodiment, the microwave emitting module has a superposition assembly 20, a first microwave assembly 30, and a second microwave assembly 40, wherein the first microwave assembly 30 and second microwave assembly 40 emit linearly-polarized microwaves toward the superposition assembly 20; then, the linearly-polarized microwaves from said two microwave assemblies are superposed in the superposition assembly 20, and then travel into the reaction chamber 10 together.

Figure 3:
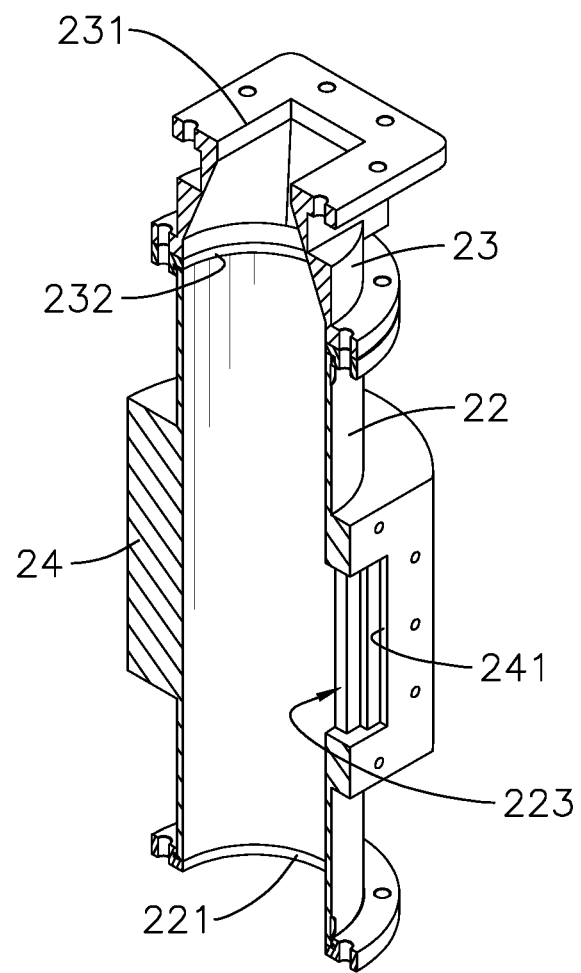
FIG. 3 is a sectional perspective view of part of the artificial diamond plasma production device in FIG. 1.

With reference to FIGS. 2 to 4, the superposition assembly 20 includes the polarizing tube 21, the directing tube 22, the rectangular-to-circular tube 23, and the connecting sleeve 24. The first microwave assembly 30 includes the first waveguide 31, the first linearly-polarized microwave source 32, and the second matched load 33. The second microwave assembly 40 includes the second waveguide 41, the second linearly-polarized microwave source 42, and the first matched load 43.

A circular polarization opening 211 and a linear polarization opening 212 are each disposed on a respective end of the polarizing tube 21. In the preferred embodiment, the circular polarization opening 211 (with reference to FIG. 4) is disposed on a lower end of the polarizing tube 21 and faces toward the microwave lens 13 and the microwave window 11 of the reaction chamber 10, while the linear polarization opening 212 is disposed on an upper end of the polarizing tube 21.

The polarizing tube 21 is configured to convert a linearly-polarized microwave into a circularly-polarized microwave or convert a circularly-polarized microwave into a linearly-polarized microwave depending on the traveling direction of the microwave.

To be specific, when an external linearly-polarized microwave enters the polarizing tube 21 from the linear polarization opening 212, said external linearly-polarized microwave is converted into a circularly-polarized microwave and exits the polarizing tube 21 via the circular polarization opening 211. When an external circularly-polarized microwave enters the polarizing tube 21 from the circular polarization opening 211, said circularly-polarized microwave is converted into a linearly-polarized microwave and exits the polarizing tube 21 via the linear polarization opening 212.

Figure 5:
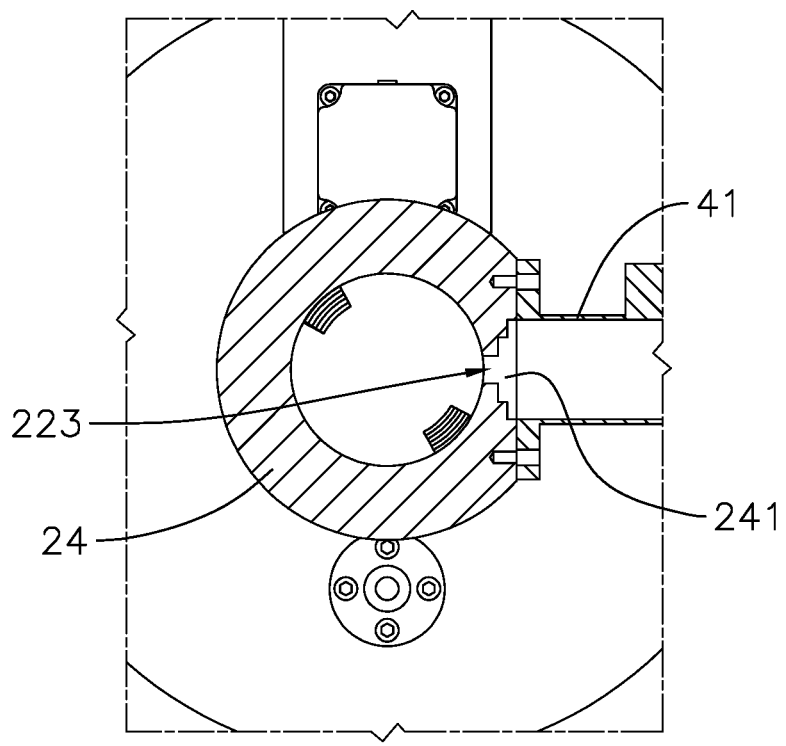
FIG. 5 is an enlarged cross-sectional view of the artificial diamond plasma production device in FIG. 1.
Figure 6:
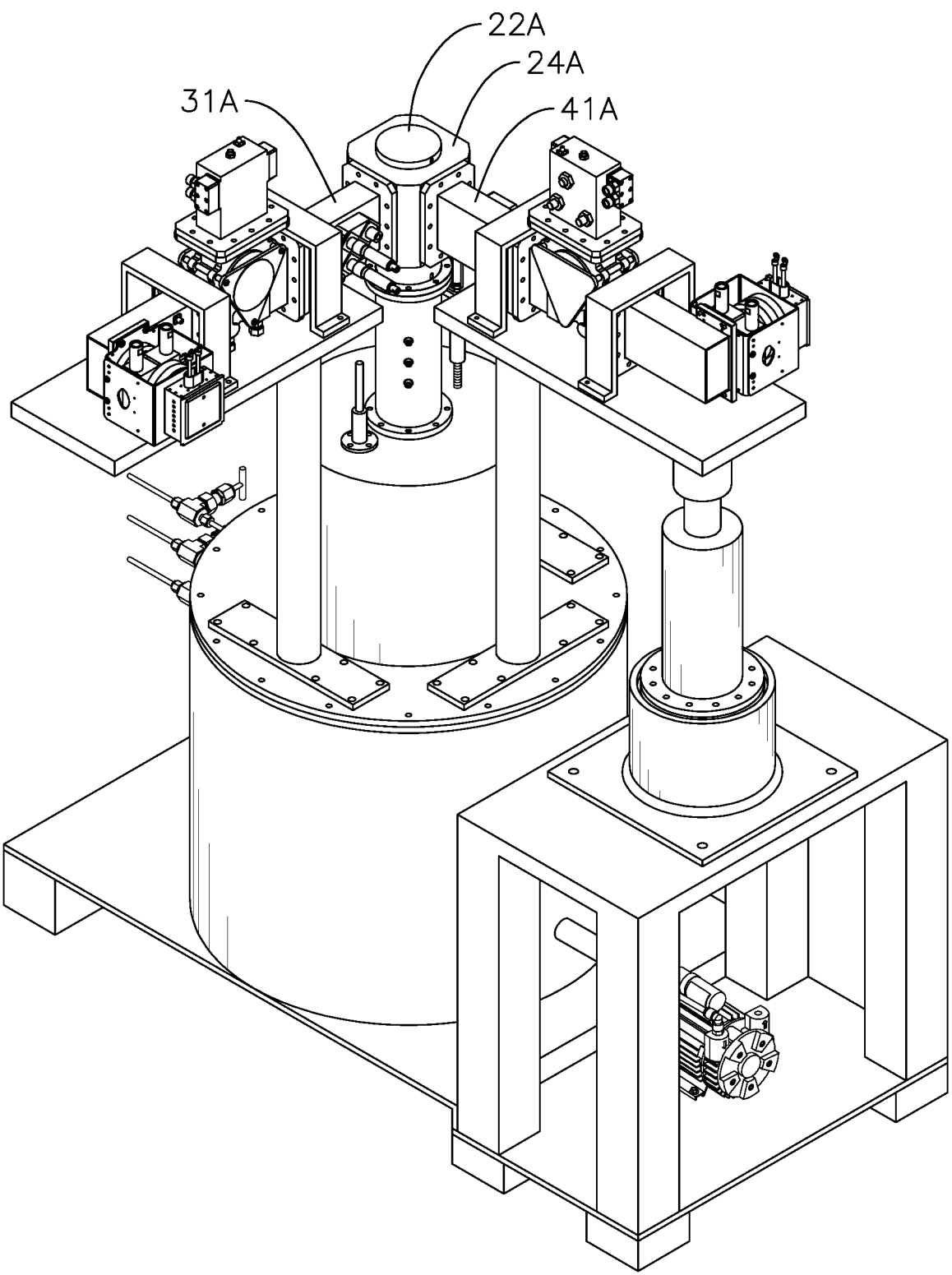
FIG. 6 is a perspective view of another embodiment of an artificial diamond plasma production device in accordance with the present invention.
Figure 7:
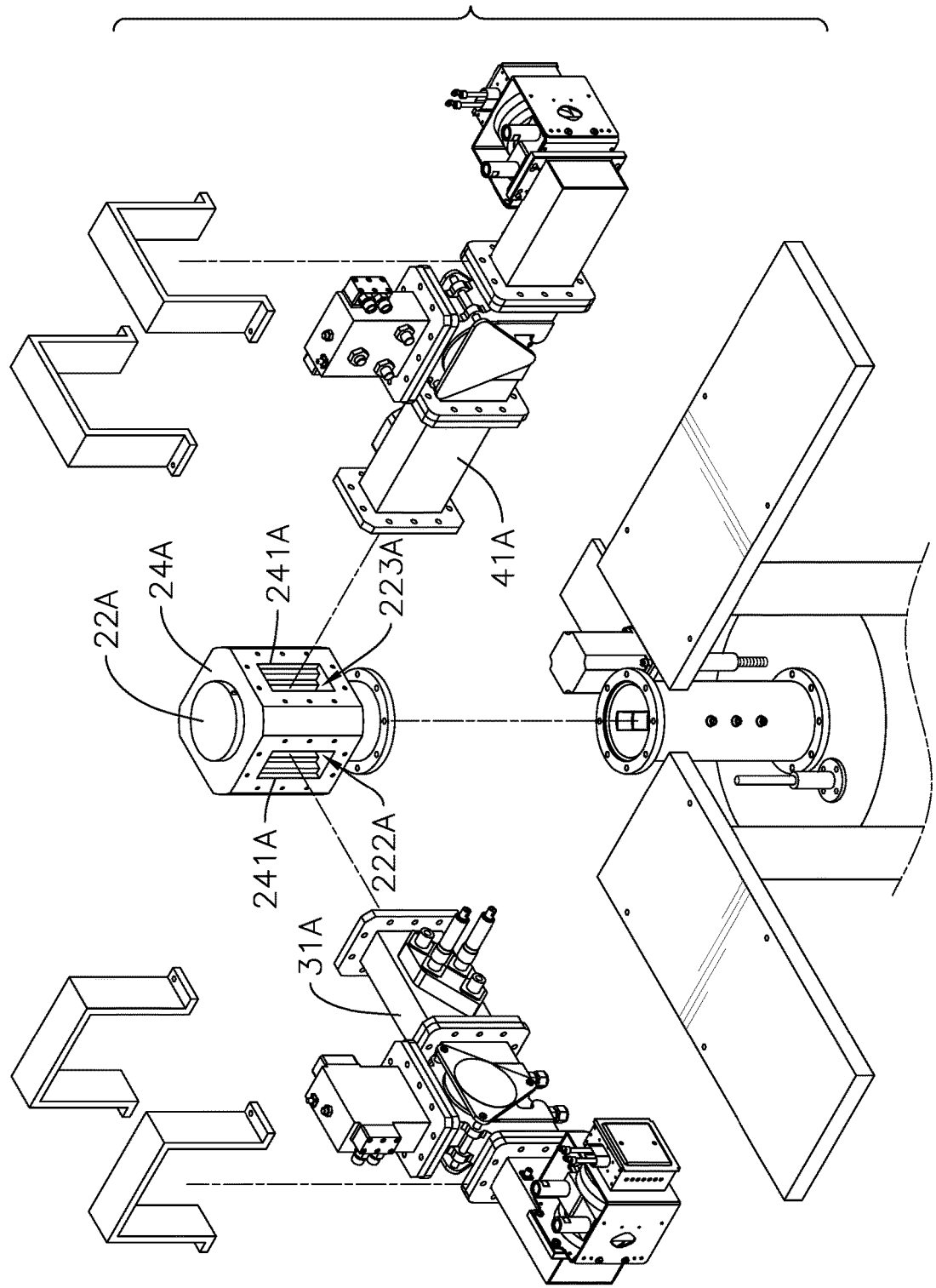
FIG. 7 is an exploded perspective view of the artificial diamond plasma production device in FIG. 6.
Figure 8:
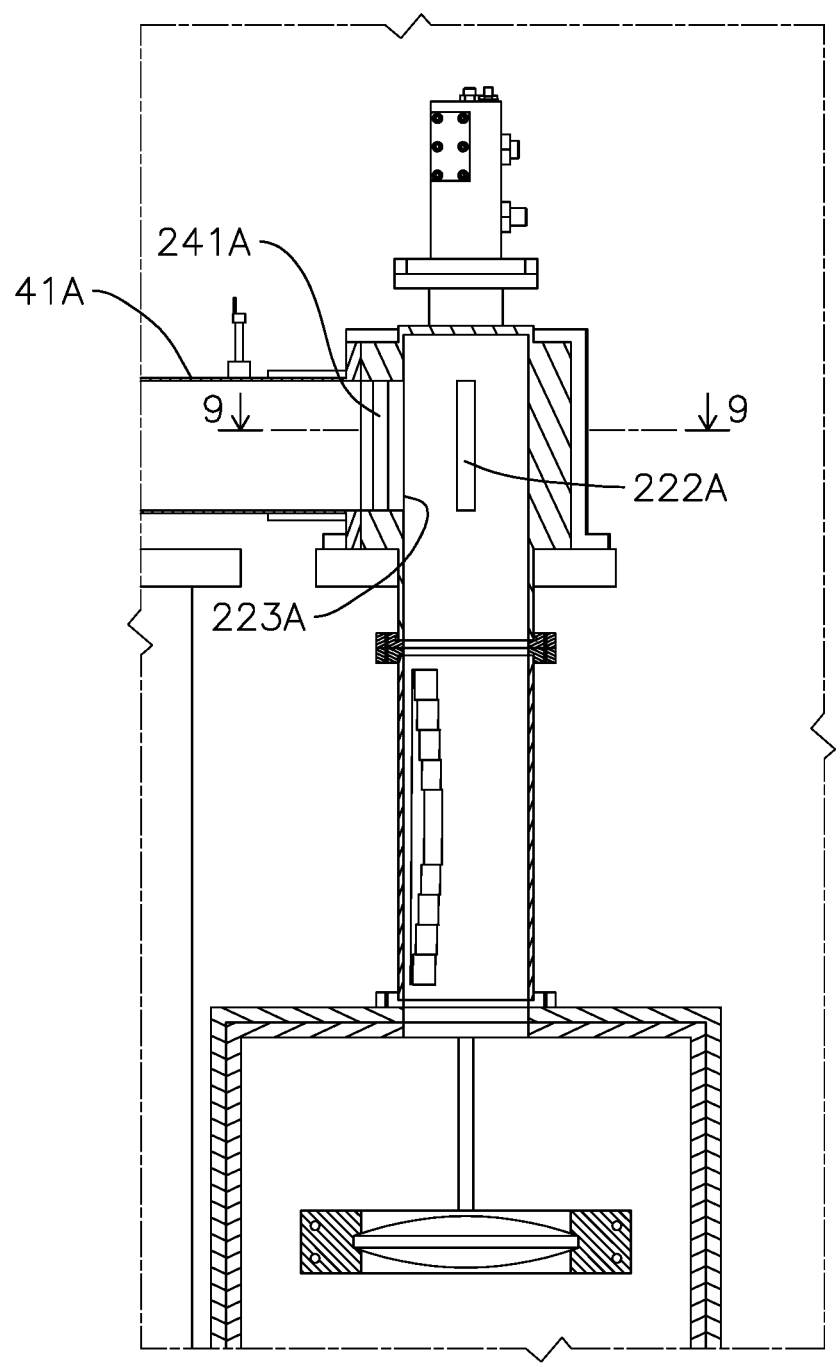
FIG. 8 is an enlarged longitudinal sectional view of the artificial diamond plasma production device in FIG. 6.
Figure 9:
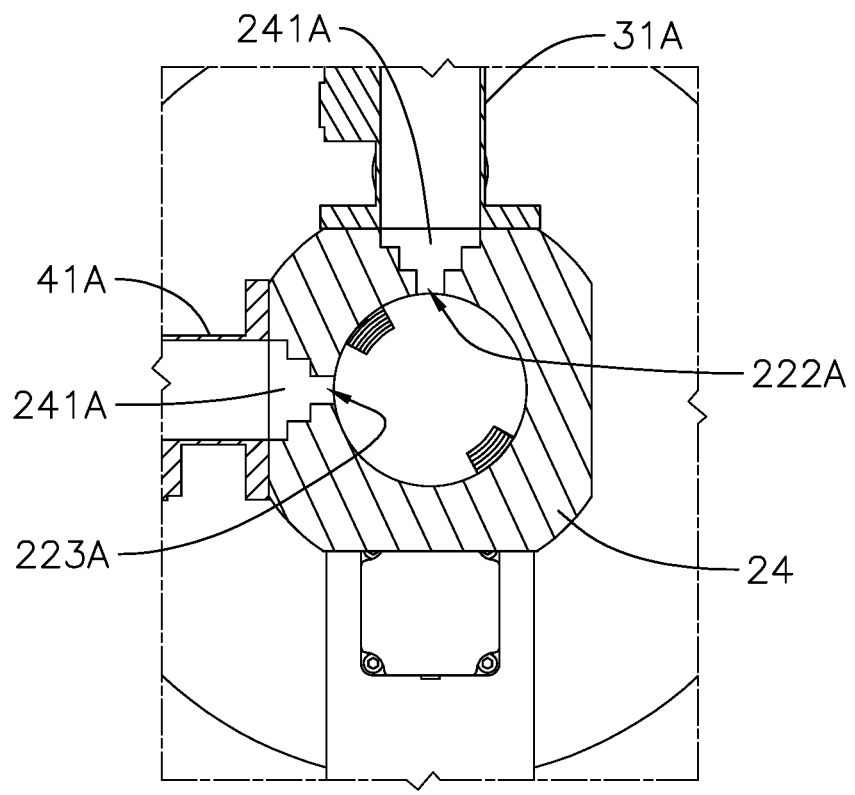
FIG. 9 is an enlarged cross-sectional view of the artificial diamond plasma production device taken across line 9-9 in FIG. 8.

With reference to FIGS. 3 to 5, the directing tube 22 has a main opening 221, a first opening 222, and a second opening 223. In the preferred embodiment, the first opening 222 and the main opening 221 are disposed oppositely on the directing tube 22. To be precise, the main opening 221 is disposed on a lower end of the directing tube 22, while the first opening 222 is disposed on an upper end of the directing tube 22. The main opening 221 is connected to the linear polarization opening 212 of the polarizing tube 21, and the second opening 223 is disposed on a sidewall of the directing tube 22; that is, an opening direction toward which the second opening 223 faces is non-parallel to an opening direction toward which the first opening 222 faces.

To be precise, the opening direction toward which the first opening 222 faces is perpendicular to the opening direction toward which the second opening 223 faces. The directing tube 22 is preferably circular in cross-section such that the main opening 221 and the first opening 222 are circular.

The rectangular-to-circular tube 23 is disposed above the directing tube 22 and connected to the first opening 222. Cross section of an inner surface of the rectangular-to-circular tube 23 gradually transforms from rectangular to circular such that a rectangular opening 231 is formed on an end of the rectangular-to-circular tube 23, while a circular opening 232 is formed on another end of the rectangular-to-circular tube 23.

The connecting sleeve 24 is located around the directing tube 22. A conversion hole 241 is formed in the connecting sleeve 24 and connects an outer surface and an inner surface of the connecting sleeve 24. The conversion hole 241 is preferably elongated and extends upwards and downwards.

An opening of the conversion hole 241 formed in the inner surface of the connecting sleeve 24 is connected to the second opening 223 of the directing tube 22, and a width of the conversion hole 241 gradually reduces toward the second opening 223. In the preferred embodiment, two opposite walls defined by the conversion hole are step-shaped such that the width of the conversion hole gradually reduces toward the second opening 223.

In the preferred embodiment, the connecting sleeve 24 and the directing tube 22 are integrally formed; in another preferred embodiment, the connecting sleeve 24 is a tube separated from the directing tube 22 and is mounted around the directing tube 22 by means such as welding.

With reference to FIGS. 2 to 4, the first waveguide 31 is preferably rectangular in cross-section. One end of the first waveguide 31 is connected to the rectangular opening 231 of the rectangular-to-circular tube 23 such that the first waveguide 31 is connected to the directing tube 22 via the rectangular-to-circular tube 23. Another end of the first waveguide 31 is connected to the first linearly-polarized microwave source 32.

The first linearly-polarized microwave source 32 generates a TE10 linearly-polarized microwave 81. The TE10 linearly-polarized microwave 81 is converted into a TE11 circularly-polarized microwave 83 by the polarizing tube 21 after travelling through the rectangular-to-circular tube 23, the directing tube 22, and the polarizing tube 21. The TE11 circularly-polarized microwave 83 exits the polarizing tube 21 via the circular polarization opening 211 and is emitted toward the microwave window 11 of the reaction chamber 10.

The second matched load 33 is mounted on the first waveguide 31. To be precise, a circulator 34 is mounted on the first waveguide 31. When there is microwave traveling reversely in the first waveguide 31 toward the first linearly-polarized microwave source 32, the circulator 34 directs said reversely-traveling microwave to the second matched load 33 where microwave is converted into heat, thereby protecting the first linearly-polarized microwave source 32 from a reversely-traveling microwave and eliminating useless microwave in the device.

The reversely-traveling microwave in the first waveguide 31 is the later-mentioned microwave generated by the second linearly-polarized microwave source 42, reflected by the reaction chamber 10, travelling through the polarizing tube 21, the directing tube 22, and the rectangular-to-circular tube 23, and finally traveling toward the first linearly-polarized microwave source 32 in the first waveguide 31.

The second waveguide 41 is preferably rectangular in cross-section. One end of the second waveguide 41 is connected to an opening of the conversion hole 241 formed in the outer surface of the connecting sleeve 24 such that the second waveguide 41 is connected to the second opening 223 of the directing tube 22 via the connecting sleeve 24. Another end of the second waveguide 41 is connected to the second linearly-polarized microwave source 42.

The second linearly-polarized microwave source 42 generates a TE10 linearly-polarized microwave 91. The TE10 linearly-polarized microwave 91 is converted into a TE11 circularly-polarized microwave 93 by the polarizing tube 21 after travelling through the rectangular-to-circular tube 23, the directing tube 22, and the polarizing tube 21. The TE11 circularly-polarized microwave 93 exits the polarizing tube 21 via the circular polarization opening 211 and is emitted toward the microwave window 11 of the reaction chamber 10. In another preferred embodiment, the second linearly-polarized microwave source 42 is omitted.

The first matched load 43 is mounted on the second waveguide 41. To be precise, a circulator 44 is mounted on the second waveguide 41. When there is a microwave traveling reversely in the second waveguide 41 toward the second linearly-polarized microwave source 42, the circulator 44 directs said reversely-traveling microwave to the first matched load 43 where the microwave is converted into heat, thereby protecting the second linearly-polarized microwave source 42 from the reversely-traveling microwave and eliminating useless microwave in the device.

The reversely-traveling microwave in the second waveguide 41 is the later-mentioned microwave generated by the first linearly-polarized microwave source 32, reflected by the reaction chamber 10, travelling through the polarizing tube 21, the directing tube 22, and finally traveling toward the second linearly-polarized microwave source 42 via the second waveguide 41. The microwave generated by the first linearly-polarized microwave source 32 is unable to travel reversely through the rectangular-to-circular tube 23 after reflected by the reaction chamber 10 due to a direction of its electrical field, and therefore travels reversely toward the second linearly-polarized microwave source 42 instead.

The reversely-traveling microwave in the first waveguide 31 is the later-mentioned microwave generated by the second linearly-polarized microwave source 42, reflected by the reaction chamber 10, travelling through the polarizing tube 21, the directing tube 22, and the rectangular-to-circular tube 23, and finally traveling toward the first linearly-polarized microwave source 32 in the first waveguide 31.

The microwave lens 13 is disposed between the circular polarization opening 211 of the polarizing tube 21 of the microwave emitting module and the diamond holder 12 of the reaction chamber 10. The microwave lens 13 converges the circularly-polarized microwaves emitted by the microwave emitting module to the focus region 121 of the diamond holder 12.

In the preferred embodiment, the microwave lens 13 is disposed outside of the reaction chamber 10 and disposed between the circular polarization opening 211 and the microwave window 11 of the reaction chamber 10. The microwave lens 13 is preferably a dielectric convex lens. In another preferred embodiment, the artificial diamond plasma production device has additional convex lens and/or concave lens to improve microwave-converging efficacy.

To use the present invention, place a diamond seed crystal A in the focus region 121 of the diamond holder 12. The first linearly-polarized microwave source 32 generates the TE10 linearly-polarized microwave 81 in the first waveguide 31. The TE10 linearly-polarized microwave 81 is converted into the TE11 linearly-polarized microwave 82 after traveling through the rectangular-to-circular tube 23 and entering into the directing tube 22.

Meanwhile, the second linearly-polarized microwave source 42 generates the TE10 linearly-polarized microwave 91 in the second waveguide 41. TE10 linearly-polarized microwave 91 is converted into a TE11 linearly-polarized microwave 92 after traveling through the conversion hole 241 of the connecting sleeve 24 and entering into the directing tube 22.

Finally, the TE11 linearly-polarized microwave 82 originated from the first linearly-polarized microwave source 32 and the TE11 linearly-polarized microwave 92 originated from the second linearly-polarized microwave source 42 both travel downward through the polarizing tube 21 and enter the polarizing tube 21. Then, the TE11 linearly-polarized microwave 82 and the TE11 linearly-polarized microwave 92 are converted into the TE11 circularly-polarized microwave 83 and the TE11 circularly-polarized microwave 93 by the polarizing tube 21 respectively, converged by the microwave lens 13, traveling through the microwave window 11, and converged in the focus region 121 to produce an artificial diamond.

When the TE11 circularly-polarized microwave 83 and the TE11 circularly-polarized microwave 93 are reflected in the reaction chamber 10, the reflected microwave that is originated from the first linearly-polarized microwave source 32 enters the second waveguide 41 via the second opening 223 and eventually converted into heat by the first matched load 43; meanwhile, the reflected microwave that is originated from the second linearly-polarized microwave source 42 enters the first waveguide 31 via the first opening 222 and eventually is converted into heat by the second matched load 33. Detailed processes are explained as follows.

When the TE11 circularly-polarized microwave 83 originated from the first linearly-polarized microwave source 32 is reflected, the reflected TE11 circularly-polarized microwave 83 travels upward through the polarizing tube 21 and is converted into the TE11 linearly-polarized microwave 82' in the directing tube 22. However, the TE11 linearly-polarized microwave 82' is unable to enter the first waveguide 31 via the first opening 222 because an electric field of the TE11 linearly-polarized microwave 82' is perpendicular to an electric field of the TE11 linearly-polarized microwave 82 after converted twice by the polarizing tube 21; instead, the TE11 linearly-polarized microwave 82' enters the second waveguide 41 via the second opening 223 and is converted into heat by the first matched load 43.

Similar to the TE11 circularly-polarized microwave 83, when the TE11 circularly-polarized microwave 93 is reflected, the reflected TE11 circularly-polarized microwave 93 travels upward through the polarizing tube 21 and is converted into the TE11 linearly-polarized microwave 92' in the directing tube 22. The TE11 linearly-polarized microwave 92' is unable to enter the second waveguide 41, but is able to enter the first waveguide 31 to be converted into heat by the second matched load 33.

Another advantage of the present invention is that by converting the linearly-polarized microwaves into the circularly-polarized microwaves, electric field distribution of the circularly-polarized microwave is more evenly distributed in the reaction chamber 10, and the present invention is capable of superposing the circularly-polarized microwaves originated from the first linearly-polarized microwave source 32 and the second linearly-polarized microwave source 42 to increase microwave power, thereby improving growth speed of the artificial diamond on the diamond holder 12.

With reference to FIGS. 6 to 9, a second embodiment of the present invention is substantially same as the first embodiment mentioned above, but the difference is that the first opening 222A of the directing tube 22A is located on the sidewall of the directing tube 22A. Moreover, the connecting sleeve 24A has two conversion holes 241A which are a first conversion hole 241A and a second conversion hole 241A.

One of two opposite openings of the first conversion hole 241A is connected to the first opening 222A of the directing tube 22A; the other one of the two opposite openings of the first conversion hole 241A is connected to the first waveguide 31A. A width of the first conversion hole 241A gradually reduces toward the first opening 222A.

One of two opposite openings of the second conversion hole 241A is connected to the second opening 223A of the directing tube 22A; the other one of the two opposite openings of the second conversion hole 241A is connected to the second waveguide 41A. A width of the second conversion hole 241A gradually reduces toward the second opening 223A.

In summary, by having the polarizing tube 21, the directing tube 22, and the first matched load 43, when the TE11 circularly-polarized microwave 83 originated from the first linearly-polarized microwave source 32 is reflected in the reaction chamber 10 due to reasons such as impedance mismatch, the reflected circularly-polarized microwave can be transformed back to the TE11 linearly-polarized microwave 82', and then travel to the first matched load via the second opening 223 of the directing tube 22, and finally transformed to heat by the first matched load 43.

As a result, the present invention prevents complex reflective standing waves from forming in the reaction chamber 10 by channeling useless microwave energy out of the reaction chamber 10, thereby keeping a stable plasma ball around the diamond seed crystal A and improving efficiency of artificial diamond production.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An artificial diamond plasma production device comprising:
   a reaction chamber being hollow and having
      a microwave window disposed on the reaction chamber such that an external microwave is capable of traveling into the reaction chamber via the microwave window;
      a diamond holder disposed in the reaction chamber, wherein an imaginary focus region is defined on the diamond holder;
   a microwave emitting module disposed outside of the reaction chamber and emitting a circularly-polarized microwave toward the microwave window of the reaction chamber; the microwave emitting module having a polarizing tube, a directing tube, a first waveguide, and a first linearly-polarized microwave source that are serially connected; the microwave emitting module further having a second waveguide and a first matched load; wherein the polarizing tube has
- a circular polarization opening disposed on an end of the polarizing tube and facing toward the microwave window of the reaction chamber; and
- a linear polarization opening disposed on another end of the polarizing tube;
- wherein when an external linearly-polarized microwave enters the polarizing tube via the linear polarization opening, said external linearly-polarized microwave is converted into a circularly-polarized microwave and exits via the circular polarization opening; when an external circularly-polarized microwave enters the polarizing tube via the circular polarization opening, said external circularly-polarized microwave is converted into a linearly-polarized microwave and exits via the linear polarization opening;

the directing tube has:
- a main opening disposed on an end of the directing tube and connected to the linear polarization opening of the polarizing tube;
- a first opening; and
- a second opening disposed on a sidewall of the directing tube; an opening direction toward which the second opening faces being non-parallel to an opening direction toward which the first opening faces;

an end of the first waveguide is connected to the first opening of the directing tube; another end of the first waveguide is connected to the first linearly-polarized microwave source;

the first linearly-polarized microwave source generates a linearly-polarized microwave; said linearly-polarized microwave is converted into a circularly-polarized microwave by the polarizing tube and is emitted toward the microwave window of the reaction chamber via the circular polarization opening of the polarizing tube;

an end of the second waveguide is connected to the second opening of the directing tube; and the first matched load is mounted on the second waveguide; and a microwave lens is disposed between the circular polarization opening of the polarizing tube of the microwave emitting module and the diamond holder of the reaction chamber; the microwave lens converging the circularly-polarized microwave emitted by the microwave emitting module to the focus region of the diamond holder.

2. The artificial diamond plasma production device as claimed in claim 1, wherein the microwave emitting module has a second linearly-polarized microwave source mounted on another end of the second waveguide; the second linearly-polarized microwave source generating a linearly-polarized microwave, said linearly-polarized microwave converted into a circularly-polarized microwave by the polarizing tube and emitted toward the microwave window of the reaction chamber via the circular polarization opening of the polarizing tube; and a second matched load mounted on the first waveguide.

3. The artificial diamond plasma production device as claimed in claim 1, wherein
the directing tube of the microwave emitting module is circular in cross-section;
the first waveguide and the second waveguide of the microwave emitting module are rectangular in cross-section.

4. The artificial diamond plasma production device as claimed in claim 2, wherein
the directing tube of the microwave emitting module is circular in cross-section;
the first waveguide and the second waveguide of the microwave emitting module are rectangular in cross-section.

5. The artificial diamond plasma production device as claimed in claim 3, wherein
the first opening and the main opening are disposed oppositely on the directing tube;
the microwave emitting module has a rectangular-to-circular tube connected between the first waveguide and the first opening of the directing tube; a cross section of an inner surface of the rectangular-to-circular tube gradually transforms from rectangular to circular.

6. The artificial diamond plasma production device as claimed in claim 4, wherein
the first opening and the main opening are disposed oppositely on the directing tube;
the microwave emitting module has a rectangular-to-circular tube connected between the first waveguide and the first opening of the directing tube; a cross section of an inner surface of the rectangular-to-circular tube gradually transforms from rectangular to circular.

7. The artificial diamond plasma production device as claimed in claim 3, wherein
the first opening and the main opening are disposed oppositely on the directing tube; and
the microwave emitting module has a connecting sleeve located around the directing tube; the second waveguide is connected to an outer surface of the connecting sleeve; the connecting sleeve has
a conversion hole being elongated and connecting the outer surface and an inner surface of the connecting sleeve; one of two opposite openings of the conversion hole connected to the second opening of the directing tube; the other one of the two opposite openings of the conversion hole connected to the second waveguide; a width of the conversion hole gradually reducing toward the second opening.

8. The artificial diamond plasma production device as claimed in claim 4, wherein
the first opening and the main opening are disposed oppositely on the directing tube; and
the microwave emitting module has a connecting sleeve located around the directing tube; the second waveguide is connected to an outer surface of the connecting sleeve; the connecting sleeve has
a conversion hole being elongated and connecting the outer surface and an inner surface of the connecting sleeve; one of two opposite openings of the conversion hole connected to the second opening of the directing tube; the other one of the two opposite openings of the conversion hole connected to the second waveguide; a width of the conversion hole gradually reducing toward the second opening.

9. The artificial diamond plasma production device as claimed in claim 7, wherein two opposite walls defined by of the conversion hole are step-shaped such that the width of the conversion hole gradually reduces toward the second opening.

10. The artificial diamond plasma production device as claimed in claim 8, wherein two opposite walls defined by the conversion hole are step-shaped such that the width of the conversion hole gradually reduces toward the second opening.

11. The artificial diamond plasma production device as claimed in claim 5, wherein the microwave emitting module has a connecting sleeve located around the directing tube; the second waveguide is connected to an outer surface of the connecting sleeve; the connecting sleeve has
   a conversion hole being elongated and connecting the outer surface and an inner surface of the connecting sleeve; one of two opposite openings of the conversion hole connected to the second opening of the directing tube; the other one of the two opposite openings of the conversion hole connected to the second waveguide; a width of the conversion hole gradually reducing toward the second opening.

12. The artificial diamond plasma production device as claimed in claim 6, wherein the microwave emitting module has a connecting sleeve located around the directing tube; the second waveguide is connected to an outer surface of the connecting sleeve; the connecting sleeve has
   a conversion hole being elongated and connecting the outer surface and an inner surface of the connecting sleeve; one of two opposite openings of the conversion hole connected to the second opening of the directing tube; the other one of the two opposite openings of the conversion hole connected to the second waveguide; a width of the conversion hole gradually reducing toward the second opening.

13. The artificial diamond plasma production device as claimed in claim 11, wherein two opposite walls defined by the conversion hole are step-shaped such that the width of the conversion hole gradually reduces toward the second opening.

14. The artificial diamond plasma production device as claimed in claim 12, wherein two opposite walls defined by the conversion hole are step-shaped such that the width of the conversion hole gradually reduces toward the second opening.

15. The artificial diamond plasma production device as claimed in claim 3, wherein
   the first opening of the directing tube is located on the sidewall of the directing tube;
   the microwave emitting module has a connecting sleeve located around the directing tube; the second waveguide is connected to an outer surface of the connecting sleeve; the connecting sleeve has
   two conversion holes; each of the conversion holes being elongated and connecting the outer surface and an inner surface of the connecting sleeve; the two conversion holes being
      a first conversion hole; one of two opposite openings of the first conversion hole connected to the first opening of the directing tube; the other one of the two opposite openings of the first conversion hole connected to the first waveguide; a width of the first conversion hole gradually reducing toward the first opening; and
      a second conversion hole; one of two opposite openings of the second conversion hole connected to the second opening of the directing tube; the other one of the two opposite openings of the second conversion hole connected to the second waveguide; a width of the second conversion hole gradually reducing toward the second opening.

16. The artificial diamond plasma production device as claimed in claim 4, wherein
   the first opening of the directing tube is located on the sidewall of the directing tube;
   the microwave emitting module has a connecting sleeve located around the directing tube; the second waveguide is connected to an outer surface of the connecting sleeve; the connecting sleeve has
   two conversion holes; each of the conversion holes being elongated and connecting the outer surface and an inner surface of the connecting sleeve; the two conversion holes being defined as
      a first conversion hole; one of two opposite openings of the first conversion hole connected to the first opening of the directing tube; the other one of the two opposite openings of the first conversion hole connected to the first waveguide; a width of the first conversion hole gradually reducing toward the first opening; and
      a second conversion hole; one of two opposite openings of the second conversion hole connected to the second opening of the directing tube; the other one of the two opposite openings of the second conversion hole connected to the second waveguide; a width of the second conversion hole gradually reducing toward the second opening.

17. The artificial diamond plasma production device as claimed in claim 1, wherein the opening direction toward which the first opening of the directing tube faces is perpendicular to the opening direction toward which the second opening of the directing tube faces.

18. The artificial diamond plasma production device as claimed in claim 14, wherein the opening direction toward which the first opening of the directing tube faces is perpendicular to the opening direction toward which the second opening of the directing tube faces.

19. The artificial diamond plasma production device as claimed in claim 16, wherein the opening direction toward which the first opening of the directing tube faces is perpendicular to the opening direction toward which the second opening of the directing tube faces.

* * * * *